United States Patent
Shimazu et al.

(10) Patent No.: US 11,152,235 B2
(45) Date of Patent: Oct. 19, 2021

(54) APPARATUS AND METHOD FOR MANUFACTURE OF SEMICONDUCTOR DEVICES

(71) Applicant: SAMSUNG ELECTRONICS CO., LTD., Suwon-si (KR)

(72) Inventors: Katsuhiro Shimazu, Seongnam-si (KR); In-Sung Hwang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 838 days.

(21) Appl. No.: 15/941,170

(22) Filed: Mar. 30, 2018

(65) Prior Publication Data

US 2019/0067058 A1 Feb. 28, 2019

(30) Foreign Application Priority Data

Aug. 24, 2017 (KR) .......................... 10-2017-0107537

(51) Int. Cl.
| | |
|---|---|
| *H01L 21/67* | (2006.01) |
| *G06F 7/58* | (2006.01) |
| *G06F 17/16* | (2006.01) |
| *G06F 5/00* | (2006.01) |
| *G06F 30/398* | (2020.01) |

(52) U.S. Cl.
CPC .......... *H01L 21/67276* (2013.01); *G06F 5/00* (2013.01); *G06F 7/588* (2013.01); *G06F 17/16* (2013.01); *G06F 30/398* (2020.01)

(58) Field of Classification Search
CPC ....... H01L 21/67276; G06F 7/588; G06F 5/00
See application file for complete search history.

(56) References Cited

U.S. PATENT DOCUMENTS

| | | | |
|---|---|---|---|
| 6,507,800 B1 * | 1/2003 | Sheu | ................ H01L 22/20 |
| | | | 257/E21.525 |
| 7,617,065 B2 | 11/2009 | Kim et al. | |
| | (Continued) | | |

FOREIGN PATENT DOCUMENTS

| | | |
|---|---|---|
| JP | 2005-11892 A | 1/2005 |
| JP | 2011-200040 A | 10/2011 |
| | (Continued) | |

OTHER PUBLICATIONS

Kibarian, Using Spatial Information to Analyze Correlations Between Test Structure Data, IEEE Transactions on Semiconductor Manufacturing, vol. 4, No. 3. Aug. 1991 (Year: 1991).*

*Primary Examiner* — Catherine T. Rastovski
*Assistant Examiner* — Liam R Casey
(74) *Attorney, Agent, or Firm* — Lee IP Law, PC

(57) ABSTRACT

A method for predicting characteristics of semiconductor devices includes collecting first data for a plurality of first characteristics from first semiconductor devices already in mass production, and collecting second data for the first characteristics and third data for a plurality of second characteristics from at least one second semiconductor device manufactured as an experimental sample before beginning the mass production. A covariance matrix is then obtained based on the first, second, and third data, and a mean vector for third semiconductor devices to be in the mass production is determined. Prediction data for third semiconductor devices is then generated based on the covariance matrix and the mean vector.

19 Claims, 16 Drawing Sheets

(56) References Cited

U.S. PATENT DOCUMENTS

| | | | |
|---|---|---|---|
| 8,805,567 B2* | 8/2014 | Lee | G05B 21/00 700/121 |
| 9,589,082 B2 | 3/2017 | Ide et al. | |
| 2006/0100873 A1 | 5/2006 | Bittner et al. | |
| 2009/0112352 A1 | 4/2009 | Barnett et al. | |
| 2009/0276077 A1* | 11/2009 | Good | G06K 9/6247 700/110 |
| 2010/0217568 A1 | 8/2010 | Takeuchi | |
| 2013/0013233 A1 | 1/2013 | Murakami et al. | |
| 2016/0185048 A1 | 6/2016 | Dave et al. | |

FOREIGN PATENT DOCUMENTS

| | | | |
|---|---|---|---|
| JP | 2012-0108748 A | 6/2012 | |
| JP | 5006214 B2 | 8/2012 | |

* cited by examiner

FIG. 3A $$\Sigma = \left\{ \begin{array}{ccc} \text{MBLK1} & \text{MBLK2} & \text{MBLK5} \\ \text{cov}(x_k, x_l) & \text{cov}(x_k, y_j) & \\ \text{cov}(y_i, x_l) & \text{cov}(y_i, y_j) & 0 \\ \text{MBLK4} & & \text{MBLK3} \\ 0 & & \text{cov}(r_i, r_j) \end{array} \right\}$$

with column labels $x_1 \cdots x_m$, $y_1 \cdots y_n$, $r_1 \cdots r_n$ and row labels $x_1, \ldots, x_m, y_1, \ldots, y_n, r_1, \ldots, r_n$.

FIG. 3B $$\bar{u} = (\bar{x}_1, \cdots, \bar{x}_m, \bar{y}_1, \cdots, \bar{y}_n, \bar{r}_1, \cdots, \bar{r}_n)$$

FIG. 4

| TYPE | VARIABLE | MEANING |
|---|---|---|
| TC | x1 | LVT_N |
|  | x2 | LVT_P |
|  | x3 | RVT_N |
|  | x4 | RVT_P |
| PC | y1 | LOG_Ids |
|  | y2 | LOG_LVcc | ent
APPARATUS AND METHOD FOR MANUFACTURE OF SEMICONDUCTOR DEVICES

CROSS-REFERENCE TO RELATED APPLICATION

Korean Patent Application No. 10-2017-0107537, filed on Aug. 24, 2017, and entitled, "Apparatus and Method for Manufacture of Semiconductor Devices," is incorporated by reference herein in its entirety.

BACKGROUND

1. Field

One or more embodiments described herein relate to the manufacture of semiconductor devices.

2. Description of the Related Art

The development phase of semiconductor devices or large scaled integrated circuits (LSIs) often includes designing and producing experimental samples of a chip. The experimental samples are fabricated to verify performance and ensure yield. From a business point of view, a sufficient perspective of yield (e.g., fail rate) should be attained before mass production starts. However, it may be difficult to estimate fail rate during mass production directly from the experimental samples. This is because the number of experimental data associated with the samples may be limited.

SUMMARY

In accordance with one or more embodiments, a method for predicting characteristics of semiconductor devices includes collecting a plurality of first data for a plurality of first characteristics from a plurality of first semiconductor devices that are already in mass production; collecting a plurality of second data for the plurality of first characteristics and a plurality of third data for a plurality of second characteristics from at least one second semiconductor device that is manufactured as an experimental sample before beginning the mass production; obtaining a covariance matrix including first, second, third, fourth, and fifth matrix blocks based on the plurality of first data, the plurality of second data, and the plurality of third data, the first matrix block representing covariances between the plurality of first characteristics, the second matrix block representing covariances between the plurality of first characteristics and the plurality of second characteristics and covariances between the plurality of second characteristics, the third matrix block representing covariances between a plurality of residues for the plurality of second characteristics, each of the fourth and fifth matrix blocks representing a zero matrix; obtaining a mean vector for a plurality of third semiconductor devices to be in the mass production, the second and third semiconductor devices being a same type of semiconductor device; and obtaining a plurality of prediction data for the plurality of third semiconductor devices based on the covariance matrix and the mean vector.

In accordance with one or more other embodiments, an apparatus for predicting characteristics of semiconductor devices includes a measurer to collect a plurality of first data for a plurality of first characteristics from a plurality of first semiconductor devices already in mass production, to collect a plurality of second data for the plurality of first characteristics and a plurality of third data for a plurality of second characteristics from at least one second semiconductor device manufactured as an experimental sample before beginning the mass production; a calculator to obtain a covariance matrix including first, second, third, fourth, and fifth matrix blocks based on the plurality of first data, the plurality of second data, and the plurality of third data, to obtain a mean vector for a plurality of third semiconductor devices to be in the mass production, the first matrix block representing covariances between the plurality of first characteristics, the second matrix block representing covariances between the plurality of first characteristics and the plurality of second characteristics and covariances between the plurality of second characteristics, the third matrix block representing covariances between a plurality of residues for the plurality of second characteristics, each of the fourth and fifth matrix blocks representing a zero matrix, the second and third semiconductor devices being a same type of semiconductor device; and a random number generator to obtain a plurality of prediction data for the plurality of third semiconductor devices based on the covariance matrix and the mean vector.

In accordance with one or more other embodiments, a method for manufacturing semiconductor devices includes obtaining a plurality of prediction data and a predicted yield based on a plurality of first data for a plurality of first characteristics, a plurality of second data for the plurality of first characteristics and a plurality of third data for a plurality of second characteristics, the plurality of first data to be collected from a plurality of first semiconductor devices already in mass production, the plurality of second data and the plurality of third data to be collected from at least one second semiconductor device manufactured as an experimental sample before beginning the mass production, the plurality of prediction data representing data for a plurality of third semiconductor devices to be in the mass production, the second and third semiconductor devices being a same type of semiconductor device, the predicted yield representing a yield in which the plurality of third semiconductor devices are in the mass production; and manufacturing the plurality of third semiconductor devices in the mass production based on a plurality of conditions for obtaining the plurality of prediction data and the predicted yield.

Obtaining the plurality of prediction data and the predicted yield includes collecting the plurality of first data; collecting the plurality of second data and the plurality of third data; obtaining a covariance matrix including first, second, third, fourth, and fifth matrix blocks based on the plurality of first data, the plurality of second data, and the plurality of third data. The first matrix block represents covariances between the plurality of first characteristics. The second matrix block represents covariances between the plurality of first characteristics and the plurality of second characteristics and covariances between the plurality of second characteristics. The third matrix block represents covariances between a plurality of residues for the plurality of second characteristics, each of the fourth and fifth matrix blocks representing a zero matrix. The method further includes obtaining a mean vector for the plurality of third semiconductor devices; obtaining the plurality of prediction data based on the covariance matrix and the mean vector; and obtaining the predicted yield based on the plurality of prediction data.

In accordance with one or more other embodiments, a non-transitory, computer-readable medium comprising code which, when executed by a processor, causes performance of a method of: collecting, by a measurer, a plurality of first data for a plurality of first characteristics from a plurality of first semiconductor devices that are already in mass production; collecting, by the measurer, a plurality of second data for the plurality of first characteristics and a plurality of third data for a plurality of second characteristics from at least one second semiconductor device that is manufactured as an experimental sample before beginning the mass production; obtaining, by a calculator, a covariance matrix including first, second, third, fourth, and fifth matrix blocks based on the plurality of first data, the plurality of second data, and the plurality of third data, the first matrix block representing covariances between the plurality of first characteristics, the second matrix block representing covariances between the plurality of first characteristics and the plurality of second characteristics and covariances between the plurality of second characteristics, the third matrix block representing covariances between a plurality of residues for the plurality of second characteristics, each of the fourth and fifth matrix blocks representing a zero matrix; obtaining, by the calculator, a mean vector for a plurality of third semiconductor devices to be in the mass production, the second and third semiconductor devices being a same type of semiconductor device; and obtaining, by a random number generator, a plurality of prediction data for the plurality of third semiconductor devices based on the covariance matrix and the mean vector.

BRIEF DESCRIPTION OF THE DRAWINGS

Features will become apparent to those of skill in the art by describing in detail exemplary embodiments with reference to the attached drawings in which:

FIGS. 3A and 3B illustrate examples of a covariance matrix and a mean vector;

FIG. 4 illustrates examples of first and second characteristics for the method;

DETAILED DESCRIPTION

Figure 1:
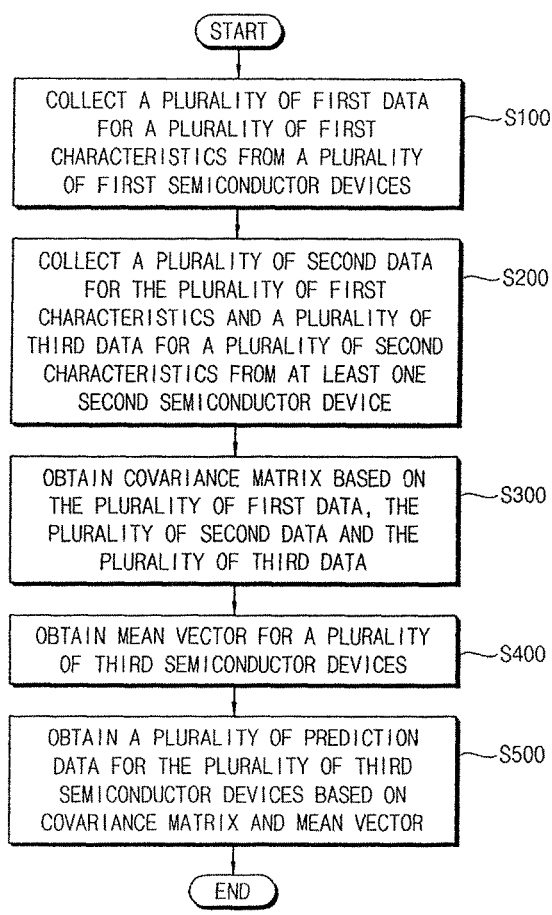
FIG. 1 illustrates an embodiment of a method for predicting characteristics of semiconductor devices.
Figure 2A:
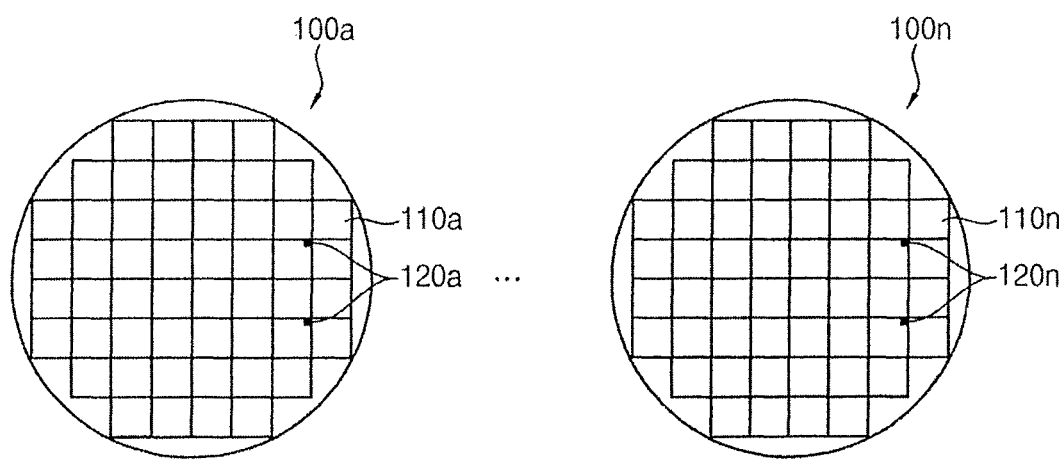
FIGS. 2A and 2B illustrate examples of semiconductor devices.
Figure 2B:
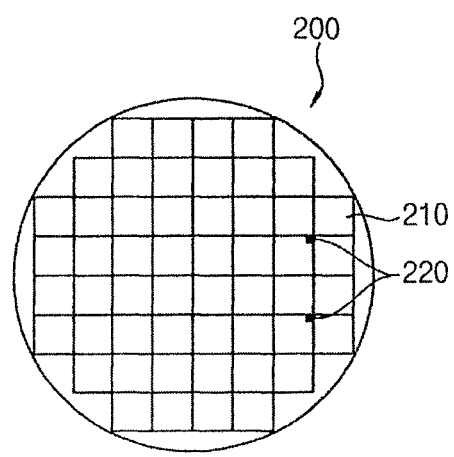

FIG. 1 is a flow chart illustrating an embodiment of a method for predicting characteristics of semiconductor devices. FIGS. 2A and 2B illustrate examples of semiconductor devices that may be used by the method. FIGS. 3A and 3B illustrate examples of a covariance matrix and a mean vector that may be used by the method.

Referring to FIGS. 1, 2A, 2B, 3A and 3B, the method includes collecting a plurality of first data for a plurality of first characteristics from a plurality of first semiconductor devices that are already in mass production (S100).

For example, as illustrated in FIG. 2A, a plurality of first semiconductor devices $110a, \ldots, 110n$ may be formed on a plurality of semiconductor wafers $100a, \ldots, 100n$ that were already manufactured in mass production. Each of the plurality of first semiconductor devices $110a$~$110n$ may include a plurality of transistors. For example, each of the plurality of first semiconductor devices $110a$~$110n$ may be a semiconductor chip including central processing unit (CPU), an application processor (AP), or another device, logic, or circuit.

A plurality of second data for the plurality of first characteristics and a plurality of third data for a plurality of second characteristics may be collected from at least one second semiconductor device manufactured as an experimental sample before beginning mass production (S200).

For example, as illustrated in FIG. 2B, at least one second semiconductor device 210 may be formed on at least one semiconductor wafer 200 manufactured as the experimental sample. As with the plurality of first semiconductor devices $110a$~$110n$ in FIG. 2A, the at least one second semiconductor device 210 may include a plurality of transistors and may be a semiconductor chip such as a CPU, an AP, or another device, logic, or circuit.

The at least one second semiconductor device 210 and the plurality of first semiconductor devices $110a$~$110n$ may be different types of semiconductor device. For example, at least one of a circuit configuration, a layout, a function, and/or an operation of the second semiconductor device 210 may be different from at least one of a circuit configuration, a layout, a function, and/or an operation of the first semiconductor devices $110a$~$110n$.

In some example embodiments, the plurality of first characteristics may correspond to characteristics (e.g., transistor characteristics) of transistors in the first semiconductor devices $110a$~$110n$ or the second semiconductor device 210. As described above, although the second semiconductor device 210 and the first semiconductor devices $110a$~$110n$ may be different types of semiconductor devices, both the first semiconductor devices $110a$~$110n$ and the second semiconductor device 210 may commonly include the same type(s) of transistors. Characteristics of a plurality of semiconductor devices to be in mass production and that are substantially the same as the second semiconductor device 210 may be predicted based on the transistor characteristics of the first semiconductor devices $110a$~$110n$ already in the mass production and the second semiconductor device 210 manufactured as the experimental sample.

For example, as illustrated in FIGS. 2A and 2B, the plurality of semiconductor wafers $100a$~$100n$ already mass produced may include test transistors $120a, \ldots, 120n$. The semiconductor wafer 200 manufactured as the experimental sample may include test transistors 220. Using the test transistors $120a$~$120n$ and 220, a plurality of data (e.g., the plurality of first data and the plurality of second data) associated with the plurality of first characteristics (e.g., the transistor characteristics) may be collected. For example, the test transistors $120a$~$120n$ and 220 may be usually implemented in scribe lines between semiconductor chips on a semiconductor wafer or in some special area in a semiconductor wafer. The layout structure of the test transistors 120a~120n and 220 may be usually fixed and constant regardless of products difference in order to control a process condition to reproduce the same transistor characteristics as a process target. Each of the test transistors 120a~120n and 220 may be referred to as a process control monitor (PCM) transistors.

In some example embodiments, the plurality of second characteristics may represent product characteristics (or operation characteristics) of the second semiconductor device 210. Characteristics of the plurality of semiconductor devices to be mass produced and that are substantially the same as the second semiconductor device 210 may be predicted based on the product characteristics of the second semiconductor device 210 manufactured as the experimental sample.

For example, using the second semiconductor device 210 in itself, a plurality of data (e.g., the plurality of third data) associated with the plurality of second characteristics (e.g., the product characteristics) may be collected. Examples of the plurality of first characteristics and the plurality of second characteristics are described with reference to FIGS. 4 and 5.

A covariance matrix is obtained based on the plurality of first data, the plurality of second data, and the plurality of third data (S300). Each of a plurality of elements in the covariance matrix may represent a covariance between two of a plurality of variables that correspond to the plurality of first characteristics, the plurality of second characteristics, and a plurality of residues for the plurality of second characteristics.

For example, as illustrated in FIG. 3A, a covariance matrix Z includes a first matrix block MBLK1, a second matrix block MBLK2, a third matrix block MBLK3, a fourth matrix block MBLK4, and a fifth matrix block MBLK5. The first matrix block MBLK1 represents covariances between the plurality of first characteristics. The second matrix block MBLK2 represents covariances between the plurality of first characteristics and the plurality of second characteristics and covariances between the plurality of second characteristics. The third matrix block MBLK3 represents covariances between the plurality of residues. Each of the fourth and fifth matrix blocks MBLK4 and MBLK5 represents zero matrix.

The plurality of first characteristics may be represented as m variables x1, . . . , xm, where m is a natural number greater than or equal to two. The plurality of second characteristics may be represented as n variables y1, . . . , yn, where n is a natural number greater than or equal to two. As with the plurality of second characteristics, the plurality of residues may be represented as n variables r1, . . . , rn. Thus, the covariance matrix $\Sigma$ may be represented as (m+2n)*(m+2n) matrix.

Each element cov(xk,xl) in the first matrix block MBLK1 may represent a covariance between two of the m variables x1~xm corresponding to the plurality of first characteristics, with each of k and l is a natural number greater than or equal to 1 and less than or equal to m. The first matrix block MBLK1 may be represented as an m*m matrix.

Each element cov(xk,yj) and each element cov(yi,xl) in the second matrix block MBLK2 may represent a covariance between one of the m variables x1~xm that correspond to the plurality of first characteristics and one of the n variables y1~yn that correspond to the plurality of second characteristics, where each of i and j is a natural number greater than or equal to one and smaller than or equal to n. Each element cov(yi,yj) in the second matrix block MBLK2 may represent a covariance between two of the n variables y1~yn that correspond to the plurality of second characteristics. In the second matrix block MBLK2, a first submatrix block including the element cov(xk,yj) may be represented as m*n matrix, a second submatrix block including the element cov(yi,xl) may be represented as n*m matrix, and a third submatrix block including the element cov(yi,yj) may be represented as n*n matrix.

Each element cov(ri,rj) in the third matrix block MBLK3 may represent a covariance between two of the n variables r1~rn that correspond to the plurality of residues. The third matrix block MBLK3 may be represented as n*n matrix.

Since the n variables r1~rn corresponding to the plurality of residues are considered to be independent of the other variables x1~xm and y1~yn, each element in the fourth and fifth matrix blocks MBLK4 and MBLK5 may be set to zero. The fourth matrix block MBLK4 may be represented as n*(m+n) zero matrix and the fifth matrix block MBLK5 may be represented as (m+n)*n zero matrix Example operations for obtaining the covariance matrix E is with reference to FIGS. 6, 7, and 8.

A mean vector for a plurality of third semiconductor devices is obtained (S400). The plurality of third semiconductor devices are to be in the mass production, e.g., the plurality of third semiconductor devices may not be manufactured yet and may be expected to be manufactured in the mass production, unlike the first semiconductor devices 110a~110n and the second semiconductor device 210. The plurality of third semiconductor devices may be referred to as target semiconductor devices. In addition, the second and third semiconductor devices may be the same type of semiconductor device. For example, the circuit configuration, layout, function, and/or operation of the third semiconductor devices may be substantially the same as the circuit configuration, layout, function, and/or operation of the second semiconductor device 210, respectively.

The mean vector may include a plurality of first mean values for the plurality of first characteristics, a plurality of second mean values for the plurality of second characteristics, and a plurality of residue mean values for the plurality of second characteristics.

For example, as illustrated in FIG. 3B, a mean vector $\bar{u}$ may include m mean values (e.g., the first mean values) $\bar{x}_1, \ldots, \bar{x}_m$ for the m variables x1~xm that correspond to the plurality of first characteristics, n mean values (e.g., the second mean values) $\bar{y}_1, \ldots, \bar{y}_n$, for the n variables y1~yn that correspond to the plurality of second characteristics, and n residue mean values (e.g., the residue mean values) $\bar{r}_1, \ldots, \bar{r}_n$ for the n variables r1~rn that correspond to the plurality of residues. An example operation for obtaining the mean vector $\bar{u}$ is described with reference to FIG. 9.

A plurality of prediction data for the plurality of third semiconductor devices may be obtained based on the covariance matrix and the mean vector (S500). For example, the plurality of prediction data may include a plurality of data for the plurality of second characteristics of the plurality of third semiconductor devices. For example, the plurality of second characteristics of the plurality of third semiconductor devices to be in the mass production may be predicted based on the plurality of first characteristics of the plurality of first semiconductor devices 110a~110n already in the mass production and the plurality of first and second characteristics of the at least one second semiconductor device 210 manufactured as the experimental sample.

Figure 5:
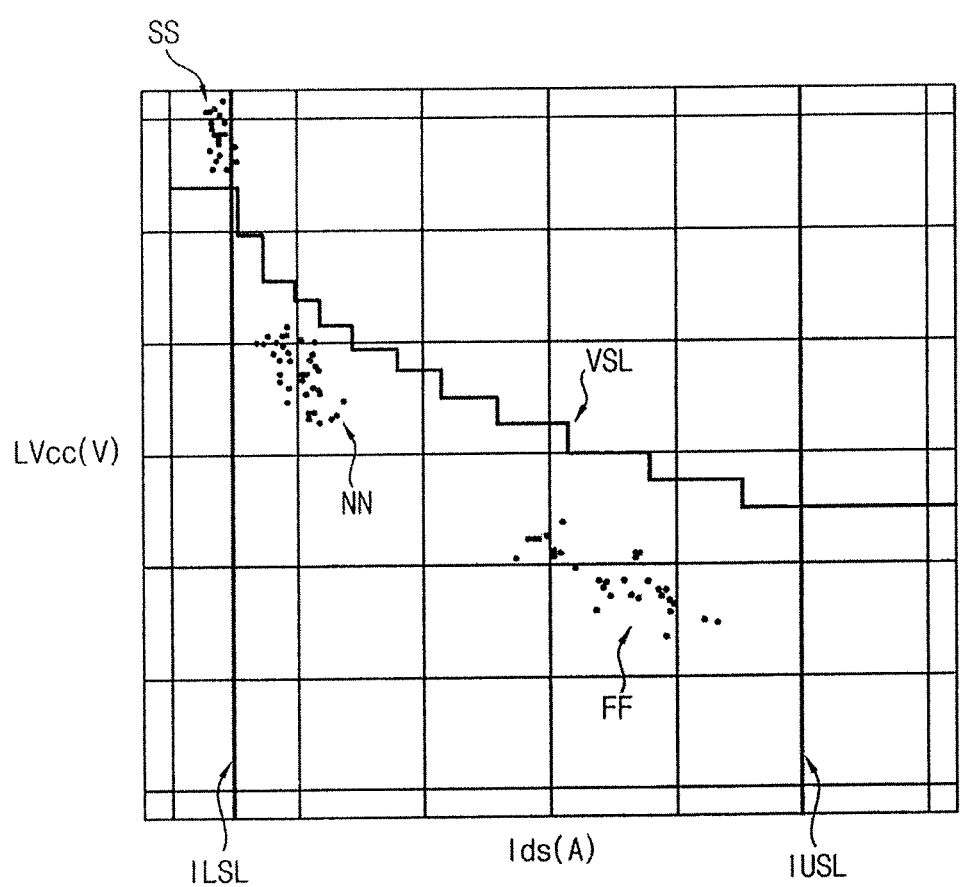
FIG. 5 illustrates an example of second characteristics collected by the method.

FIG. 4 illustrates an example of a plurality of first and second characteristics that may be used by the method. FIG. 5 is a graph illustrating an example of the plurality of second characteristics that may be collected by the method.

Referring to FIGS. 2A, 2B, 4, and 5, the plurality of first characteristics may represent transistor characteristics TC associated with transistors in the semiconductor device, and may include, for example, threshold voltages of different types of transistors in the semiconductor device.

In one embodiment, each semiconductor device (e.g., each of the first, second, and third semiconductor devices) may include four different types of transistors. A variable x1 may represent a threshold voltage of an N-type transistor LVT_N having a relatively low threshold voltage. A variable x2 may represent a threshold voltage of a P-type transistor LVT_P having a relatively low threshold voltage. A variable x3 may represent a threshold voltage of an N-type transistor RVT_N having a regular (or normal) threshold voltage. A variable x4 may represent a threshold voltage of a P-type transistor RVT_P having a regular threshold voltage. In an example of FIG. 4, m may be set to four and the plurality of first characteristics may be represented as four variables (e.g., first variables) x1~x4.

The plurality of second characteristics may represent product characteristics PC (or operation characteristics) of the semiconductor device. For example, a variable y1 may represent a log value LOG_Ids of a static current Ids of each semiconductor device (e.g., each of the second and third semiconductor devices). A variable y2 may represent a log value LOG_LVcc of a lowest operation voltage LVcc of each semiconductor device. In an example of FIG. 4, n may be set to two, and the plurality of second characteristics may be represented as two variables (e.g., second variables) y1 and y2. In an example of FIG. 4, the static current Ids and the lowest operation voltage LVcc are not used in and of themselves and the log values LOG_Ids and LOG_LVcc are used. This is because the log values may be useful (e.g., show better linearity and approach better to normal distribution) for an equation model to be described later. Thus, in one but not all embodiments, the static current Ids and the lowest operation voltage LVcc may not be essential to the method. In one embodiment, the static current Ids and the lowest operation voltage LVcc may be used in and of themselves instead of the log values LOG_Ids and LOG_LVcc.

As illustrated in FIG. 4, when the plurality of first characteristics correspond to the transistor characteristics TC and are represented as four variables x1~x4, the plurality of first data for the plurality of first characteristics collected from the plurality of first semiconductor devices 110a-110n in operation S100 of FIG. 1 may include a very large number of data for each of four variables x1~x4. For example, X threshold voltages for each of four variables x1~x4 may be collected as the plurality of first data, where X is a very large natural number. Similarly, the plurality of second data for the plurality of first characteristics that are collected from the at least one second semiconductor device 210 in operation S200 of FIG. 1 may include a relatively small number of data for each of four variables x1~x4. For example, Y threshold voltages for each of four variables x1~x4 may be collected as the plurality of second data, where Y is a natural number and X>>Y.

In addition, as illustrated in FIG. 4, when the plurality of second characteristics correspond to the product characteristics PC and are represented as two variables y1 and y2, the plurality of third data for the plurality of second characteristics that are collected from the at least one second semiconductor device 210 in operation S200 of FIG. 1 may include a relatively small number of data for each of two variables y1 and y2. For example, Y static current and Y lowest operation voltages for two variables y1 and y2 may be collected as the plurality of third data.

The plurality of first data for the plurality of first characteristics have been repeatedly and continuously collected and accumulated while the plurality of first semiconductor devices 110a~110n have been manufactured in the mass production. The plurality of first data for the plurality of first characteristics are supposed to include chip to chip variation, wafer to wafer variation, lot to lot variation, variation by process equipment difference, fluctuation of process equipment condition, and many other variation factors which may occur in the mass production phase. The plurality of first data may be referred to as mass volume data, which may be used to calculate the elements in the first matrix block MBLK1 of the covariance matrix $\Sigma$.

The plurality of second data for the plurality of first characteristics and the plurality of third data for the plurality of second characteristics may be collected from the at least one second semiconductor device 210. As described above, the second semiconductor device 210 may be fabricated as the experimental sample of the product chip after completing the chip design, in order to verify performance and ensure yield. The process condition may be aligned at a specification (or spec) center to represent mass production condition. It may also often be aligned at specification corners to investigate any risks at corner conditions. The experiment may be a so-called corner experiment. From the corner experiment, the plurality of second data and the plurality of third data may be obtained. The plurality of second data and the plurality of third data may be referred to as relational data, which may be obtained from the corner experiment and may be used to calculate the elements in the second and third matrix blocks MBLK2 and MBLK3 of the covariance matrix Z.

As illustrated in FIG. 5, the corner experiment may be performed by three corners SS, NN, and FF of the transistor characteristics (e.g., the plurality of first characteristics). The threshold voltage may be adjusted at different corners in the specification window. The product characteristics (e.g., the plurality of second characteristics) of the experimental sample (e.g., the second semiconductor device 210) may be plotted with specification lines. The product characteristics may be, for example, the lowest operation voltage LVcc and the static current Ids.

In FIG. 5, lines ILSL and IUSL may represent specifications of the static current Ids. Data between the lines ILSL and IUSL may be judged as pass data. Data outside the lines ILSL and IUSL may be judged as fail data. A line VSL may represent a specification of the lowest operation voltage LVcc. In this example, the specification of the lowest operation voltage LVcc may not always be a simple single specification, but in some embodiments may be determined stepwise by the static current Ids. Data under the line VSL may be judged as pass data. Data above the line VSL may be judged as fail data. The corners SS, NN and FF may represent conditions in which the threshold voltage is adjusted at the upper specification limit, the specification center, and the lower specification limit, respectively.

As illustrated in FIG. 5, the corner experiment indicates that a large fail rate may occur at the SS corner in mass production as the fail rate by the experimental sample shows about 100%, while a small fail rate is expected at the NN and FF corners as the fail rate by the experimental samples is almost 0%. However, it may be difficult to estimate an exact fail rate in the mass production directly from the experiment data, because the data count may be too small and limited.

In the method of predicting characteristics of semiconductor devices according to example embodiments, the plurality of second characteristics of the plurality of third semiconductor devices that are to be in the mass production may be predicted based on the plurality of first characteristics of the plurality of first semiconductor devices 110a~110n already in mass production and the plurality of first and second characteristics of the at least one second semiconductor device 210 manufactured as the experimental sample. The first variables x1~x4 that correspond to the plurality of first characteristics may be used as descriptive variables to predict the second variables (e.g., objective variables) y1 and y2 that correspond to the plurality of second characteristics.

Hereinafter, example embodiments will be described based on an example where the plurality of first characteristics include four transistor characteristics TC and the plurality of second characteristics include two product characteristics PC.

Figure 6:
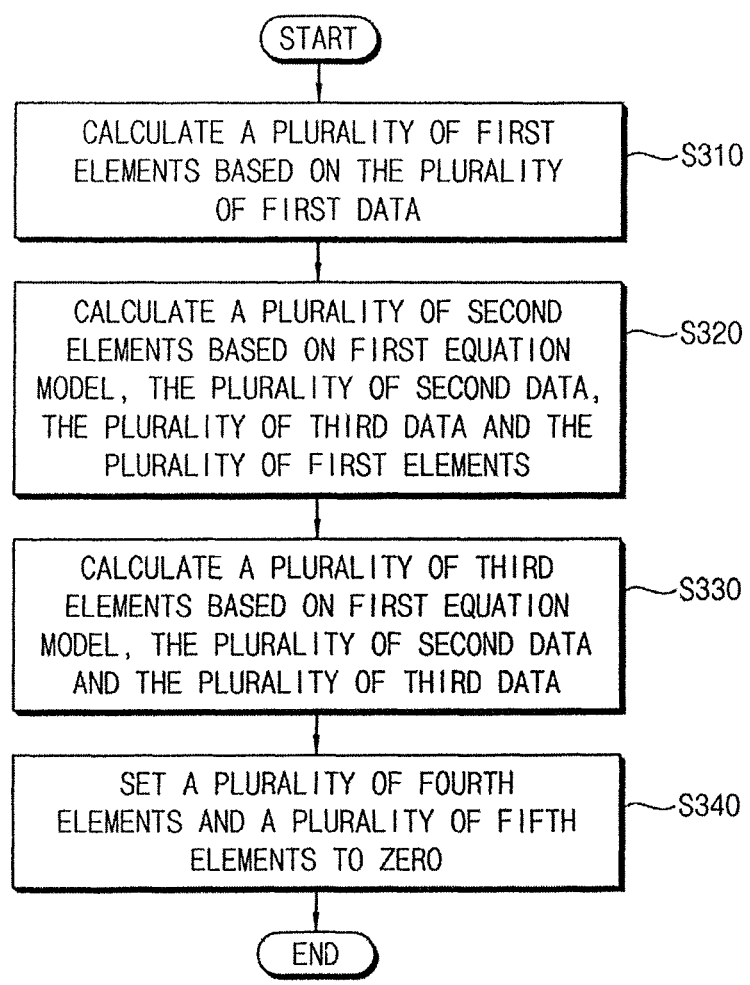
FIG. 6 illustrates an example for obtaining a covariance matrix.

FIG. 6 illustrates a flow chart illustrating an example for obtaining a covariance matrix Σ in FIG. 1. Referring to FIGS. 1, 3A, and 6, in operation S300, a plurality of first elements in the first matrix block MBLK1 may be calculated based on the plurality of first data (S310). For example, each of the plurality of first element (e.g., cov(xk,xl)) may be calculated based on Equation 1 (e.g., according to the definition of covariance):

$$\operatorname{cov}(a, b) \equiv \frac{\sum_{p=1}^{N}\{a(p) - \bar{a}\} \cdot \{b(p) - \bar{b}\}}{N - 1} \tag{1}$$

where cov(a,b) represents a covariance between variable a and variable b, a(p) and b(p) represents p-th data of the variable a and the variable b, respectively, $\bar{a}$ and $\bar{b}$ represent a mean or an average of the variable a and the variable b, respectively, and N represents the number of data or data count.

As illustrated in FIG. 4, when the plurality of first characteristics TC are represented as four variables (e.g., the first variables) x1~x4, the first matrix block MBLK1 may be calculated based on the threshold voltages for each of four variables x1~x4 collected from the plurality of first semiconductor devices 110a~110n, and may be represented as a 4*4 matrix.

A plurality of second elements in the second matrix block MBLK2 may be calculated based on a first equation model, the plurality of second data, the plurality of third data, and the plurality of first elements (S320).

Figure 7:
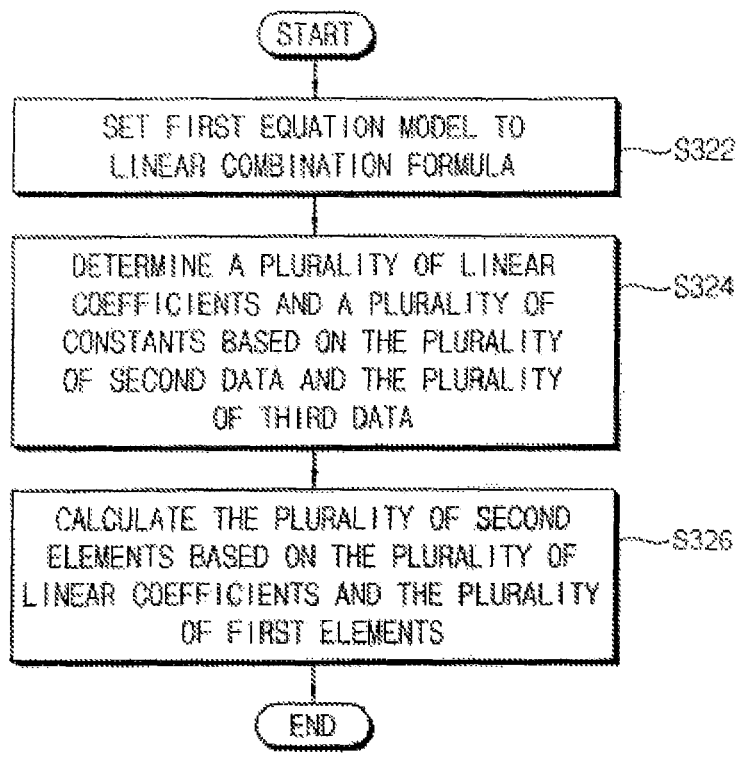
FIG. 7 illustrates an example for calculating a plurality of second elements.

FIG. 7 illustrates a flow chart illustrating an example of calculating a plurality of second elements in FIG. 6. Referring to FIGS. 6 and 7, in operation S320, the first equation model may be set to or built by a linear combination formula (S322). For example, the linear combination formula may represent a relationship between yi and xk (e.g., correlate yi with xk), and may be set based on Equation 2:

$$y_i = \Sigma_k^m C_{i,k} \cdot x_k + c_i \tag{2}$$

where Ci,k represents a linear coefficient and ci represents a constant.

A plurality of linear coefficients (e.g., Ci,k) and a plurality of constants (e.g., ci) for the linear combination formula may be determined based on the plurality of second data and the plurality of third data (S324). For example, the plurality of linear coefficients (e.g., Ci,k) and the plurality of constants (e.g., ci) may be determined by putting the plurality of second data and the plurality of third data in Equation 2.

As illustrated in FIG. 4, when the plurality of first characteristics TC are represented as four variables (e.g., the first variables) x1~x4, and when the plurality of second characteristics PC are represented as two variables (e.g., the second variables) y1 and y2, m=4; i=1, 2; and k=1, 2, 3, 4 in Equation 2. In other words, Equation 2 may be represented in a specific example by Equation 3:

$$\begin{pmatrix} y_1 \\ y_2 \end{pmatrix} = \begin{pmatrix} C_{1,1} & C_{1,2} & C_{1,3} & C_{1,4} \\ C_{2,1} & C_{2,2} & C_{2,3} & C_{2,4} \end{pmatrix} \begin{pmatrix} x_1 \\ x_2 \\ x_3 \\ x_4 \end{pmatrix} + \begin{pmatrix} c_1 \\ c_2 \end{pmatrix} \tag{3}$$

The linear coefficients C1,1, C1,2, C1,3, C1,4, C2,1, C2,2, C2,3 and C2,4 and the constants c1 and c2 may be determined by regression to fit to the relational data (e.g., the threshold voltages for each of four variables x1~x4 and the static current and the lowest operation voltages for two variables y1 and y2 that are collected from the at least one second semiconductor device 210) based on Equation 3.

The plurality of second elements may be calculated based on the plurality of linear coefficients (e.g., Ci,k) and the plurality of first elements (e.g., cov(xk,xl)) (S326). For example, among the plurality of second elements, the each element cov(xk,yj) in the first submatrix block of the second matrix block MBLK2 may be calculated based on Equation 4, and each element cov(yi,xl) in the second submatrix block of the second matrix block MBLK2 may be calculated based on Equation 5.

$$\operatorname{cov}(x_k, y_j) = \Sigma_l^m \{C_{j,l} \cdot \operatorname{cov}(x_k, x_l)\} \tag{4}$$

$$\operatorname{cov}(y_i, x_l) = \Sigma_k^m \{C_{i,k} \cdot \operatorname{cov}(x_k, x_l)\} \tag{5}$$

Equation 6 may be substantially the same as Equation 2 and may be defined using different suffixes j and l. Among the plurality of second elements, the each element cov(yi,yj) in the third submatrix block of the second matrix block MBLK2 may be calculated based on Equation 7 obtained by Equations 2 and 6.

$$y_j = \Sigma_l^m C_{j,l} \cdot x_l + c_j \tag{6}$$

$$\operatorname{cov}(y_i, y_j) = \Sigma_k^m \Sigma_l^m \{C_{i,k} \cdot C_{j,l} \cdot \operatorname{cov}(x_k, x_l)\} \tag{7}$$

As described above, the plurality of second elements may be calculated based on the plurality of linear coefficients (e.g., Ci,k) and the plurality of first elements. Thus, sufficient reliable covariances may be estimated.

Referring again to FIG. 6, in operation S300 for obtaining the covariance matrix Σ, a plurality of third elements in the third matrix block MBLK3 may be calculated based on the first equation model, the plurality of second data, and the plurality of third data (S330).

Figure 8:
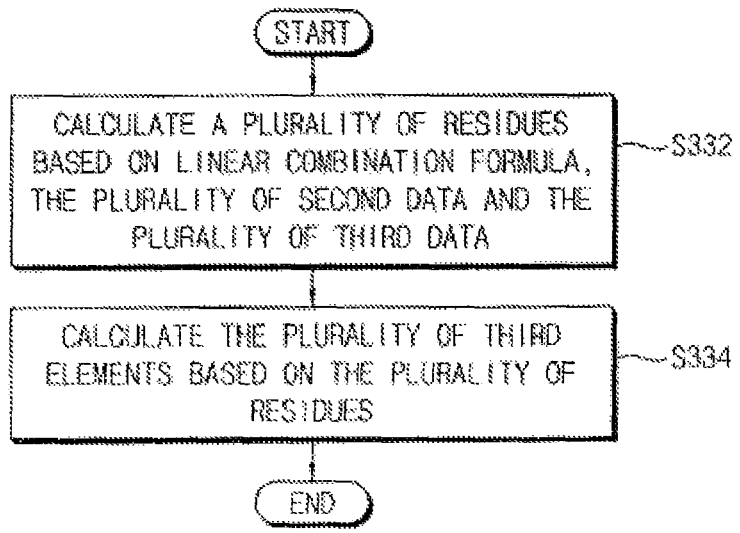
FIG. 8 illustrates an example for calculating a plurality of third elements.

FIG. 8 illustrates a flow chart of an example for calculating a plurality of third elements in FIG. 6. Referring to FIGS. 6 and 8, in operation S330, the plurality of residues may be calculated based on the linear combination formula including the plurality of linear coefficients (e.g., Ci,k) and the plurality of constants (e.g., ci), the plurality of second data, and the plurality of third data (S332).

The residue of the first equation model (e.g., residue of the linear combination formula) may be calculated for each of the plurality of second characteristics PC, and may represent a gap between an observed value in the relational data (e.g., the plurality of third data) and a predicted value by the first equation model. For example, the plurality of residues may represent gaps between predicted values and observed values of the plurality of second characteristics PC.

In one embodiment, the plurality of residues may be calculated based on Equation 8:

$$r_i = obs \cdot y_i - y_i = obs \cdot y_i - (\Sigma_k^m C_{i,k} \cdot obs \cdot x_k + c_i) \tag{8}$$

In Equation 8, ri represents a residue for yi, yi represents a predicted value of each of the second characteristics PC by the first equation model, and obs·xk and obs·yi represents an observed value of each of the first characteristics TC and each of the second characteristics PC in the relational data (e.g., the plurality of second data and the plurality of third data), respectively.

The plurality of third elements may be calculated based on the plurality of residues (e.g., ri) (S334). For example, a residue rj for yj of Equation 6 may be defined using Equation 8 and different suffixes j and l. Each of the plurality of third elements (e.g., cov(ri,rj)) may be calculated based on Equation 1.

Referring again to FIG. 6, in operation S300 for obtaining the covariance matrix Σ, each of a plurality of fourth elements in the fourth matrix block MBLK4 and each of a plurality of fifth elements in the fifth matrix block MBLK5 may be set to zero (S340).

As a result, the covariance matrix Σ illustrated in FIG. 3A may be obtained.

Figure 9:
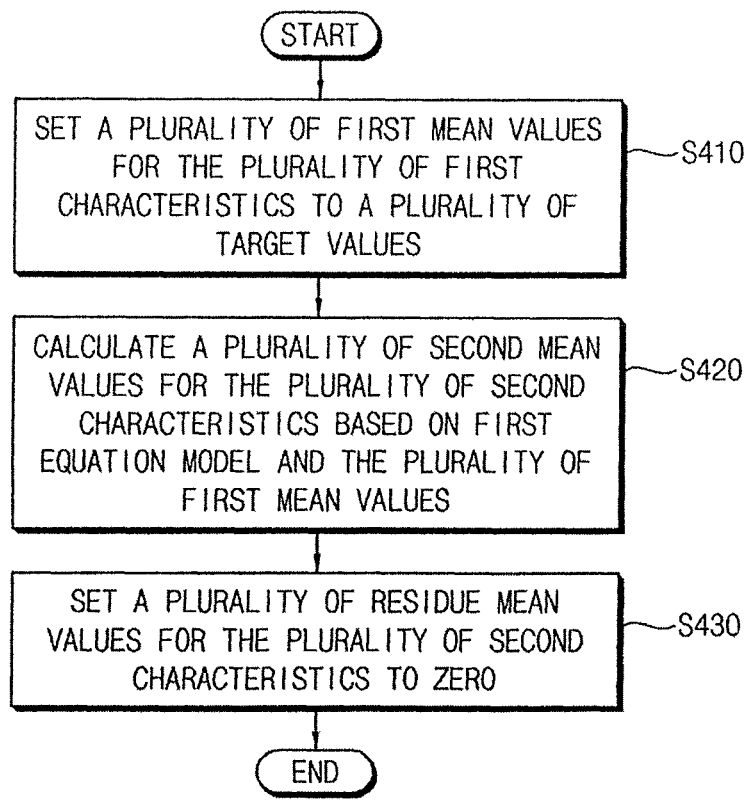
FIG. 9 illustrates an example for obtaining a mean vector.

FIG. 9 illustrates a flow chart of an example for obtaining a mean vector in FIG. 1. Referring to FIGS. 1, 3B, and 8, the mean vector $\bar{u}$ may be defined as the mean values $\bar{x}_1 \sim \bar{x}_m$, $\bar{y}_1 \sim \bar{y}_n$, and $\bar{r}_1 \sim \bar{r}_n$, of the transistor characteristics, the product characteristics, and the residue which are expected in the mass production of the plurality of third semiconductor devices.

In operation S400 for obtaining the mean vector $\bar{u}$, the plurality of first mean values $\bar{x}_1 \sim \bar{x}_m$ for the plurality of first characteristics TC may be set to a plurality of target values (S410). For example, as illustrated in FIG. 4, when m=4, the first mean values $\bar{x}_1$, $\bar{x}_2$, $\bar{x}_3$ and $\bar{x}_4$ may be set at the process control target of the threshold voltages of the transistors (e.g., the transistor characteristics TC) in the mass production.

The plurality of second mean values $\bar{y}_1 \sim \bar{y}_n$ for the plurality of second characteristics PC may be calculated based on the first equation model and the plurality of first mean values $\bar{x}_1 \sim \bar{x}_m$ (S420). For example, as illustrated in FIG. 4, when m=4 and n=2, the second mean values $\bar{y}_1$ and $\bar{y}_2$ may be calculated by putting the linear coefficients C1,1, C1,2, C1,3, C1,4, C2,1, C2,2, C2,3 and C2,4, the first mean values $\bar{x}_1$, $\bar{x}_2$, $\bar{x}_3$ and $\bar{x}_4$, and the constants c1 and c2 in Equation 3.

Each of the plurality of residue mean values $\bar{r}_1 \sim \bar{r}_n$ for the plurality of second characteristics PC may be set to zero (S430). For example, as illustrated in FIG. 4, when n=2, the residue mean values $\bar{r}_1$ and $\bar{r}_2$ may be set to zero. The equation model may be designed to reduce or minimize the residue with targeting the mean value of residue at zero. Thus, in at least one embodiment, it may be appropriate to set the residue mean values to zero. As a result, the mean vector $\bar{u}$ illustrated in FIG. 3B may be obtained. As described with reference to FIG. 11C, the mean vector $\bar{u}$ may be used to determine a distribution center of random numbers when the random numbers are generated.

Figure 10:
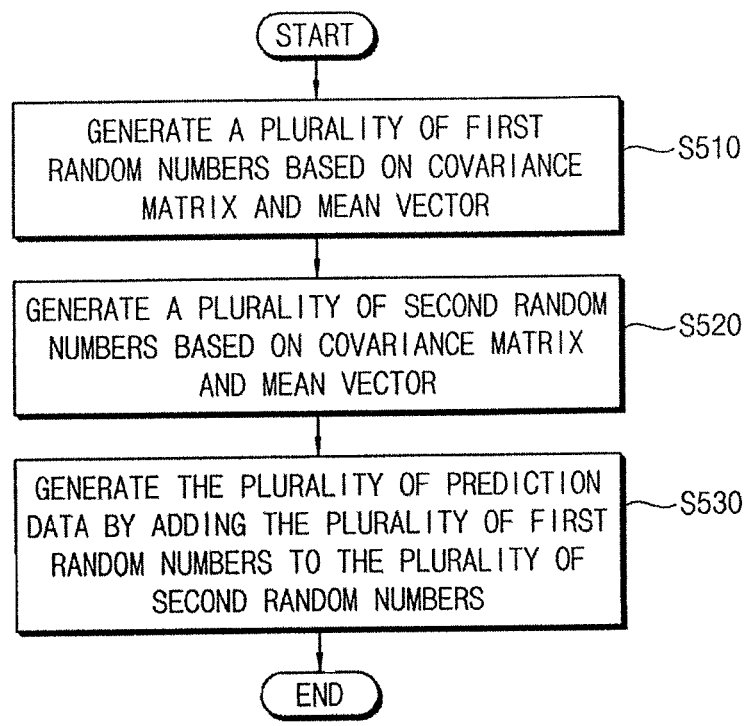
FIG. 10 illustrates an embodiment for obtaining a plurality of prediction data.
Figure 11A:
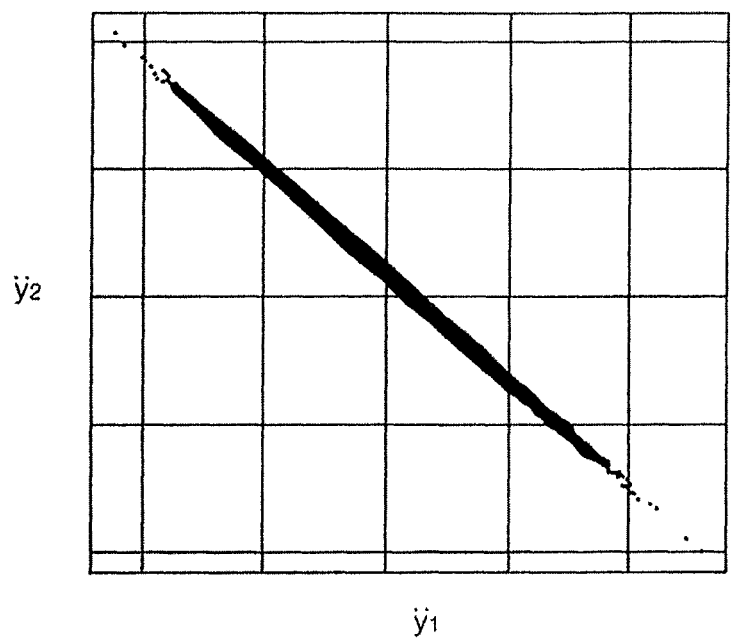
FIGS. 11A-11C illustrate examples of random numbers and prediction data generated by one or more embodiments of the method.
Figure 11B:
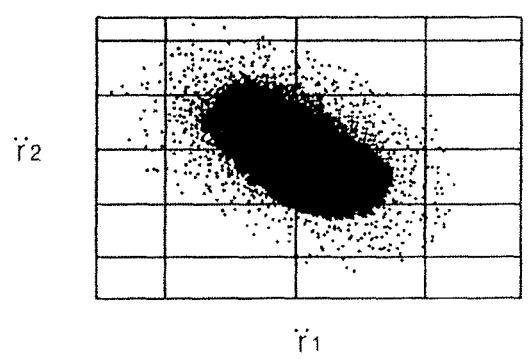
Figure 11C:
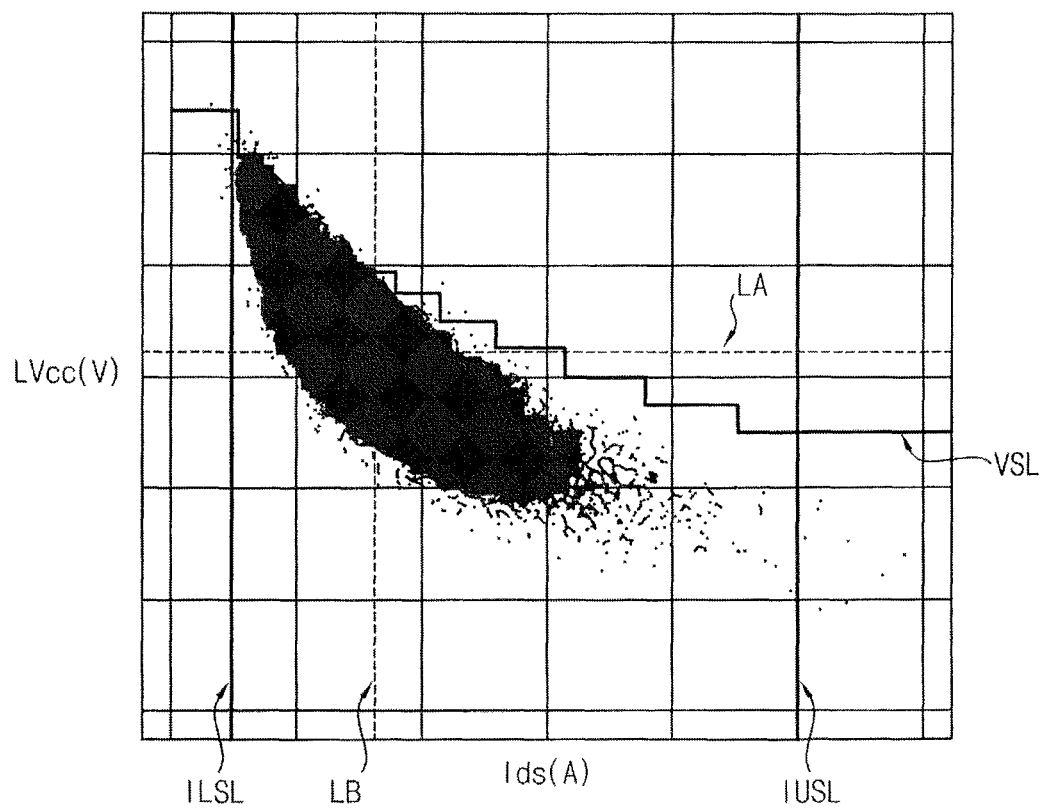
Figure 12:
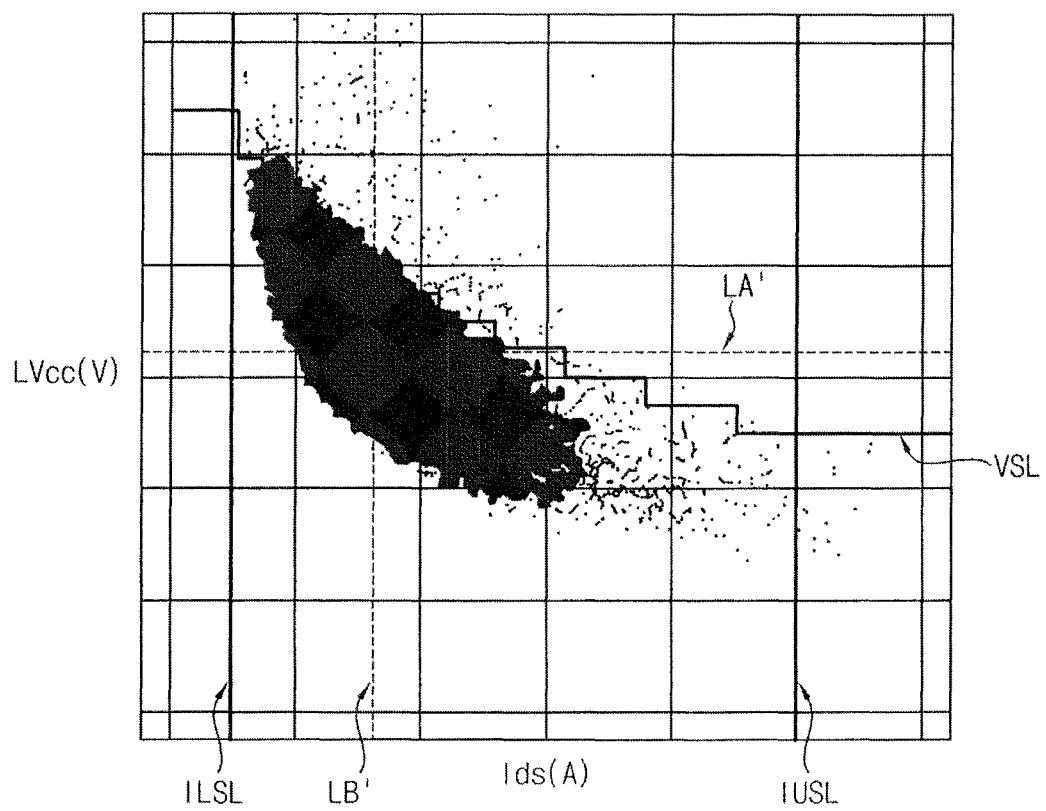
FIG. 12 illustrates an example of data measured from semiconductor devices that are in mass production.

FIG. 10 illustrates a flow chart of an example for obtaining a plurality of prediction data in FIG. 1. FIGS. 11A to 11C are graphs illustrating examples of a plurality of random numbers and a plurality of prediction data that may be generated by the method. FIG. 12 illustrates a graph of an example of a plurality of data measured from semiconductor devices that are in mass production.

Referring to FIGS. 1, 10, 11A, 11B, 11C, and 12, in operation S500 for obtaining the plurality of prediction data, a plurality of first random numbers may be generated based on the covariance matrix Σ and the mean vector $\bar{u}$ (S510), a plurality of second random numbers may be generated based on the covariance matrix Σ and the mean vector $\bar{u}$ (S520), and the plurality of prediction data may be generated by adding the plurality of first random numbers to the plurality of second random numbers (S530). The plurality of first random numbers may correspond to the plurality of second characteristics PC that are to be predicted. The plurality of second random numbers may correspond to the plurality of residues.

To generate the random numbers, a unified vector u of the plurality of first characteristics TC (e.g., xi), the plurality of second characteristics PC (e.g., yi) and the plurality of residues (e.g., ri) may be defined by Equation 9. When the unified vector u is considered to approach to multi-dimensional normal distribution, a probability density function of the unified vector u may be defined by Equation 10:

$$u \equiv (x_1, \ldots, x_m, y_1, \ldots, y_n, r_1, \ldots, r_n) \tag{9}$$

$$norm(u) = \left\{ (2\pi)^N \cdot \left| \sum \right| \right\}^{-\frac{1}{2}} \cdot e^{\left( -\frac{1}{2}(u-\bar{u})\sum^{-1}(u-\bar{u})^T \right)} \tag{10}$$

In Equation 10, norm(u) represents the probability density function of the unified vector u, $\bar{u}$ represents a mean vector of the unified vector u, uT represents a transpose of the unified vector u, Σ represents a covariance matrix of the unified vector u, and N represents a dimension of the unified vector u. In this case, N=m+2n according to Equation 9.

A random number vector ü corresponding to the unified vector u may be defined by Equation 11:

$$\ddot{u} \equiv (\ddot{x}_1, \ldots, \ddot{x}_m, \ddot{y}_1, \ldots, \ddot{y}_n, \ddot{r}_1, \ldots, \ddot{r}_n) \tag{11}$$

In Equation 11, $\ddot{x}_k$, $\ddot{y}_i$ and $\ddot{r}_i$ represent a random number for xi, yi and ri, respectively. The random number vector ü may be generated in a way to reproduce the probability density function norm(u) which is characterized by the covariance matrix Σ and the mean vector $\bar{u}$. The random number vector ü may be used to prepare the random numbers $\ddot{y}_i$ and $\ddot{r}_i$ for generating the plurality of prediction data.

As illustrated in FIG. 4, if m=4 and n=2, an ensemble or a combination of two random numbers (e.g., the first random numbers) $\ddot{y}_1$ and $\ddot{y}_2$, and an ensemble or a combination of two random numbers (e.g., the second random numbers) $\ddot{r}_1$ and $\ddot{r}_2$ may be prepared. An example of the first random numbers $\ddot{y}_1$ and $\ddot{y}_2$ is illustrated in FIG. 11A, and an example of the second random numbers $\ddot{r}_1$ and $\ddot{r}_2$ is illustrated in FIG. 11B.

Since characteristics to be predicted are the second variables (e.g., objective variables) y1 and y2, the plurality of prediction data may be generated based on only the first random numbers $\ddot{y}_1$ and $\ddot{y}_2$ for the second variables y1 and y2. The residue may correspond to some portion of the values of the objective variables (e.g., y1 and y2) which could not be explained by the known descriptive variables (e.g., x1~x4). Other unknown or unobserved descriptive variables may exist as other contributors to determine the objective variables, and these may be adapted better to a different model formula. Examples include metal resistivity, transistor leakage, capacitance, propagation delay of primitive circuit, and/or other characteristics which may affect the static current Ids and the lowest operation voltage LVcc. To consider the other unknown or unobserved descriptive variables, the residues (e.g., the residue variables r1 and r2) may be additionally used.

It is unknown in the process to predict the objective variables by the model, but the prediction may have a certain error as a potential residue which may be given by Equation 8. Assuming an imaginable residue determined by a certain way, a new objective variable Yi to compensate a potential residue for the objective variable yi may be defined by Equation 12. In addition, a random number for the objective variable Yi may be defined by Equation 13.

$$Y_i = y_i + r_i = \Sigma_k {}^m C_{i,k} x_k + c_i + r_i \qquad (12)$$

$$\ddot{Y}_i = \ddot{y}_i + \ddot{r}_i \qquad (13)$$

In Equation 13, $\ddot{y}_i$ represents a random number for yi with variation determined by the linear model variables (e.g., known descriptive variables), $\ddot{r}_i$ represents a random number for ri with variation determined by unknown factors that are not considered by the linear model (e.g., unknown descriptive variables), and $\ddot{Y}_i$ represents a random number for the plurality of prediction data with all variation.

When n=2, the first random numbers $\ddot{y}_1$ and $\ddot{y}_2$ and the second random numbers $\ddot{r}_1$ and $\ddot{r}_2$ may be prepared, as illustrated, for example, in FIGS. 11A and 11B. Based on Equation 13, a random number $\ddot{Y}_1$ may be obtained by adding the random number $\ddot{y}_1$ to the random number $\ddot{r}_1$, and a random number $\ddot{Y}_2$ may be obtained by adding the random number $\ddot{y}_2$ to the random number $\ddot{r}_2$. In addition, as illustrated in FIG. 4, the variables y1 and y2 may represent the log value LOG_Ids of the static current Ids and the log value LOG_LVcc of the lowest operation voltage LVcc, respectively. Thus, a graph of the plurality of prediction data may be obtained as illustrated, for example, in FIG. 11C, based on Equations 14 and 15.

$$Ids = \exp(\ddot{Y}_1) = \exp(\ddot{y}_1 + \ddot{r}_1) \qquad (14)$$

$$LVcc = \exp(\ddot{Y}_2) = \exp(\ddot{y}_2 + \ddot{r}_2) \qquad (15)$$

Lines ILSL, IUSL and VSL in FIG. 11C may be substantially the same as the lines ILSL, IUSL and VSL in FIG. 5, respectively. An intersection of two lines LA and LB may represent the distribution center that is determined by the mean vector ū.

After the method of predicting the characteristics of the semiconductor devices according to example embodiments is performed, the plurality of third semiconductor devices may be manufactured in the mass production. A graph of a plurality of real or actual data collected from the plurality of third semiconductor devices may be obtained, for example, as illustrated in FIG. 12. As with FIG. 11C, lines ILSL, IUSL and VSL in FIG. 12 may be substantially the same as the lines ILSL, IUSL and VSL in FIG. 5, respectively. An intersection of two lines LA' and LB' may represent the distribution center.

Figure 13A:
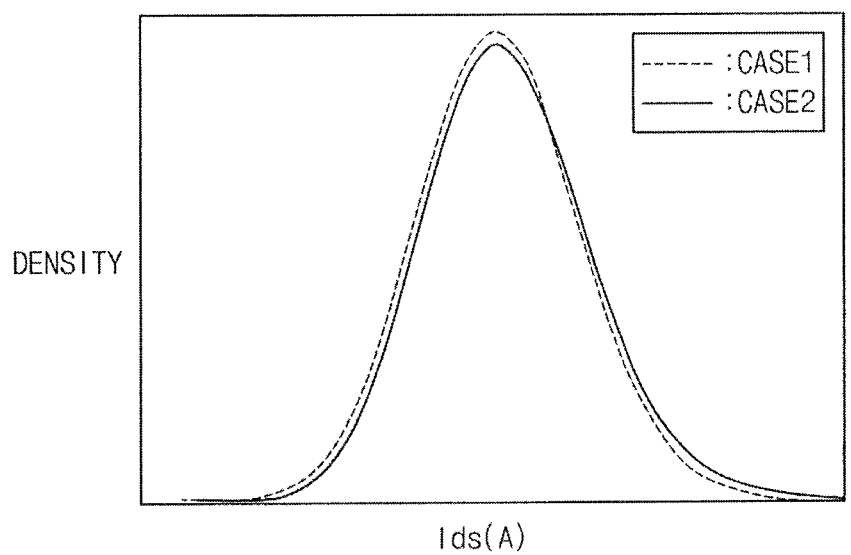
FIGS. 13A and 13B illustrate examples relating to performance of the method.
Figure 13B:
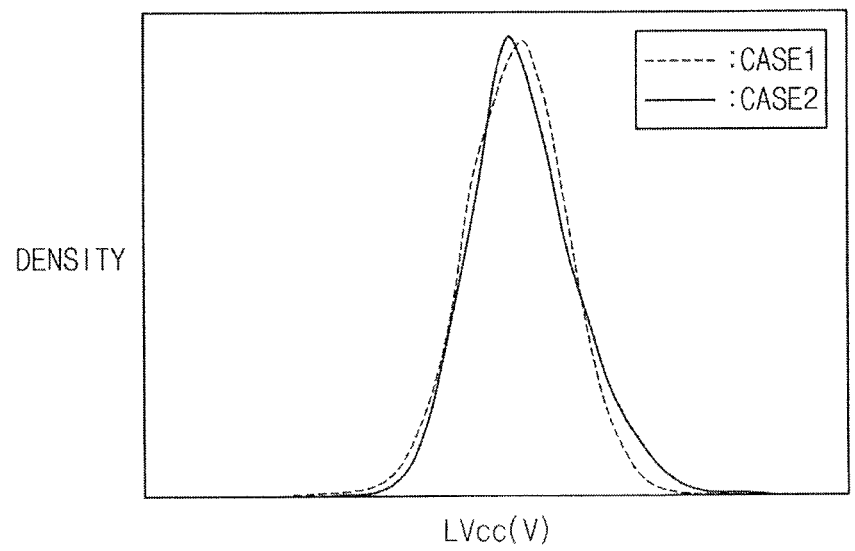

FIGS. 13A and 13B illustrate graphs for describing an example of the performance of the method. In FIGS. 13A and 13B, CASE1 represents the plurality of prediction data of FIG. 11C obtained by performing the method for predicting the characteristics of the semiconductor devices according to example embodiments. CASE2 represents the plurality of real or actual data of FIG. 12 collected from the plurality of third semiconductor devices manufactured in the mass production.

FIG. 13A illustrates the density of data distributed along the line LA in FIG. 11C and the density of data distributed along the line LA' in FIG. 12. FIG. 13B illustrates the density of data distributed along the line LB in FIG. 11C and the density of data distributed along the line LB' in FIG. 12. It may be verified that the distribution of the plurality of prediction data of FIG. 11C is very similar to the distribution of the plurality of real or actual data of FIG. 12. The method for predicting the characteristics of the semiconductor devices according to example embodiments may therefore be considered to have outstanding performance and accuracy.

Figure 14:
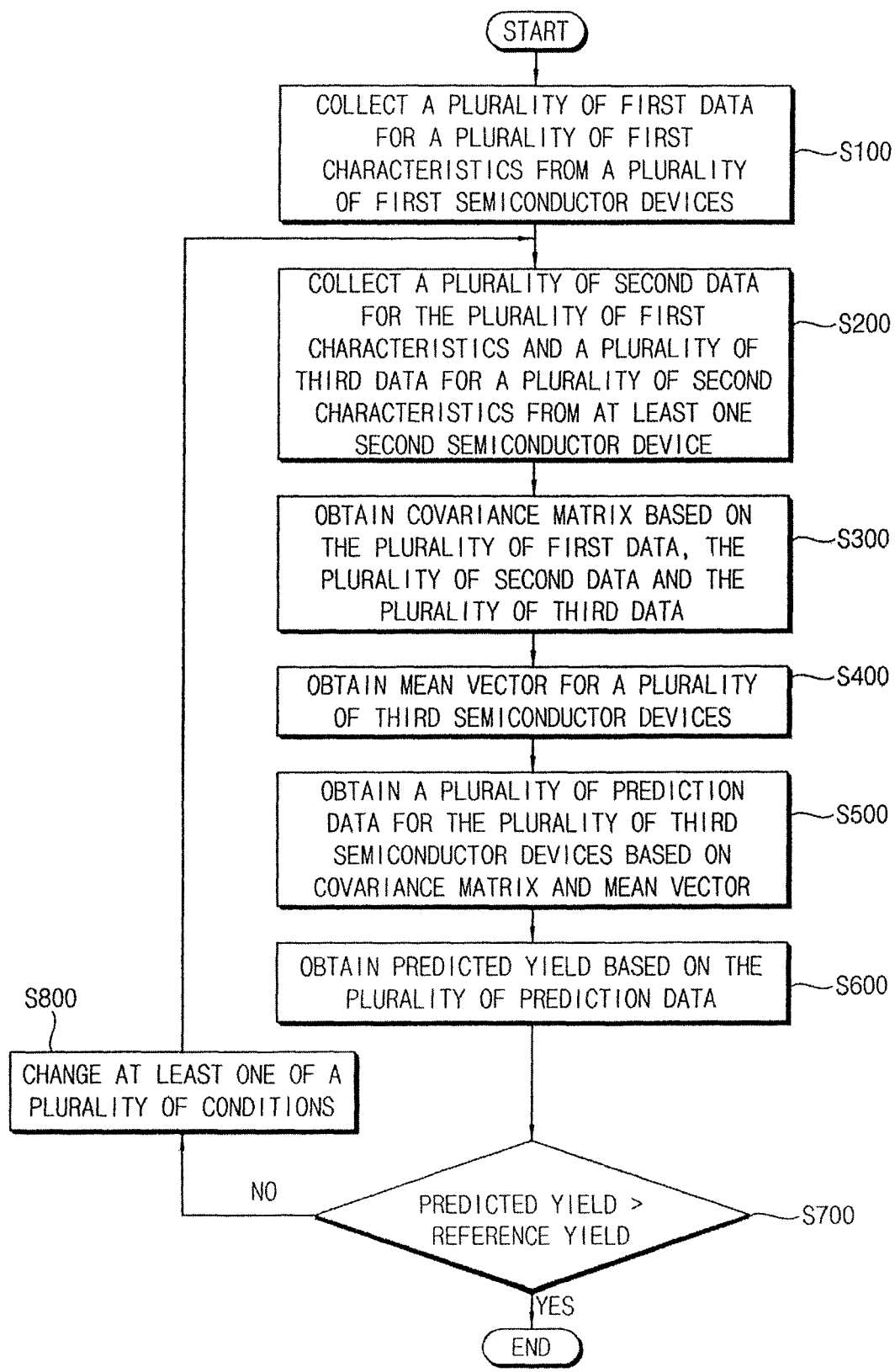
FIG. 14 illustrates another embodiment of a method for predicting characteristics of semiconductor devices.

FIG. 14 illustrates another embodiment of a method for predicting characteristics of semiconductor devices. In the method of FIG. 14, operations S100, S200, S300, S400, and S500 may be substantially the same as operations S100, S200, S300, S400, and S500 in FIG. 1, respectively.

In this method, predicted yield may be obtained based on the plurality of prediction data for the plurality of third semiconductor devices (S600). The predicted yield may represent a yield in which the plurality of third semiconductor devices are in the mass production. For example, the predicted yield may be a ratio of the number of a plurality of pass or normal data to the total number of the plurality of prediction data. In the example of FIG. 11C, the plurality of pass or normal data may be between the lines ILSL and IUSL and under the line VSL.

When the predicted yield is less than or equal to a reference yield (S700: NO), at least one of a plurality of conditions may be changed (S800). The plurality of conditions may represent conditions for the mass production of the plurality of third semiconductor devices.

In some example embodiments, a design condition for the plurality of third semiconductor devices may be changed. For example, the plurality of third semiconductor devices may be re-designed to change a circuit configuration, a layout, and/or another characteristic. In other example embodiments, a process or a process condition for manufacturing the plurality of third semiconductor devices may be changed. For example, process equipment, process orders, various parameters in process, etc., may be tuned. In another example embodiments, a product specification for the plurality of third semiconductor devices may be changed. For example, a location of at least one of the lines ILSL, IUSL, and VSL in FIG. 11C may be adjusted. According to example embodiments, at least two of the design condition, the process condition, and the product specification may be simultaneously or concurrently changed.

After operation S800 for changing at least one of the plurality of conditions, operations S200, S300, S400, S500, S600, and S700 may be repeated. For example, a new experimental sample may be manufactured based on the changed condition, new experimental data may be collected from the new experimental sample, a changed covariance matrix and mean vector may be obtained based on the new experimental data, and a plurality of prediction data and a predicted yield may be obtained again.

When the predicted yield is greater than the reference yield (S700: YES), the method according to example embodiments may be terminated without additional action. Then, mass production of the plurality of third semiconductor devices may be prepared.

According to example embodiments, a predicted fail rate may be used instead of the predicted yield. The predicted fail rate may be, for example, a ratio of the number of a plurality of fail data to the total number of the plurality of prediction data. When the predicted fail rate is greater than a reference fail rate, operation S800 may be performed.

Figure 15:
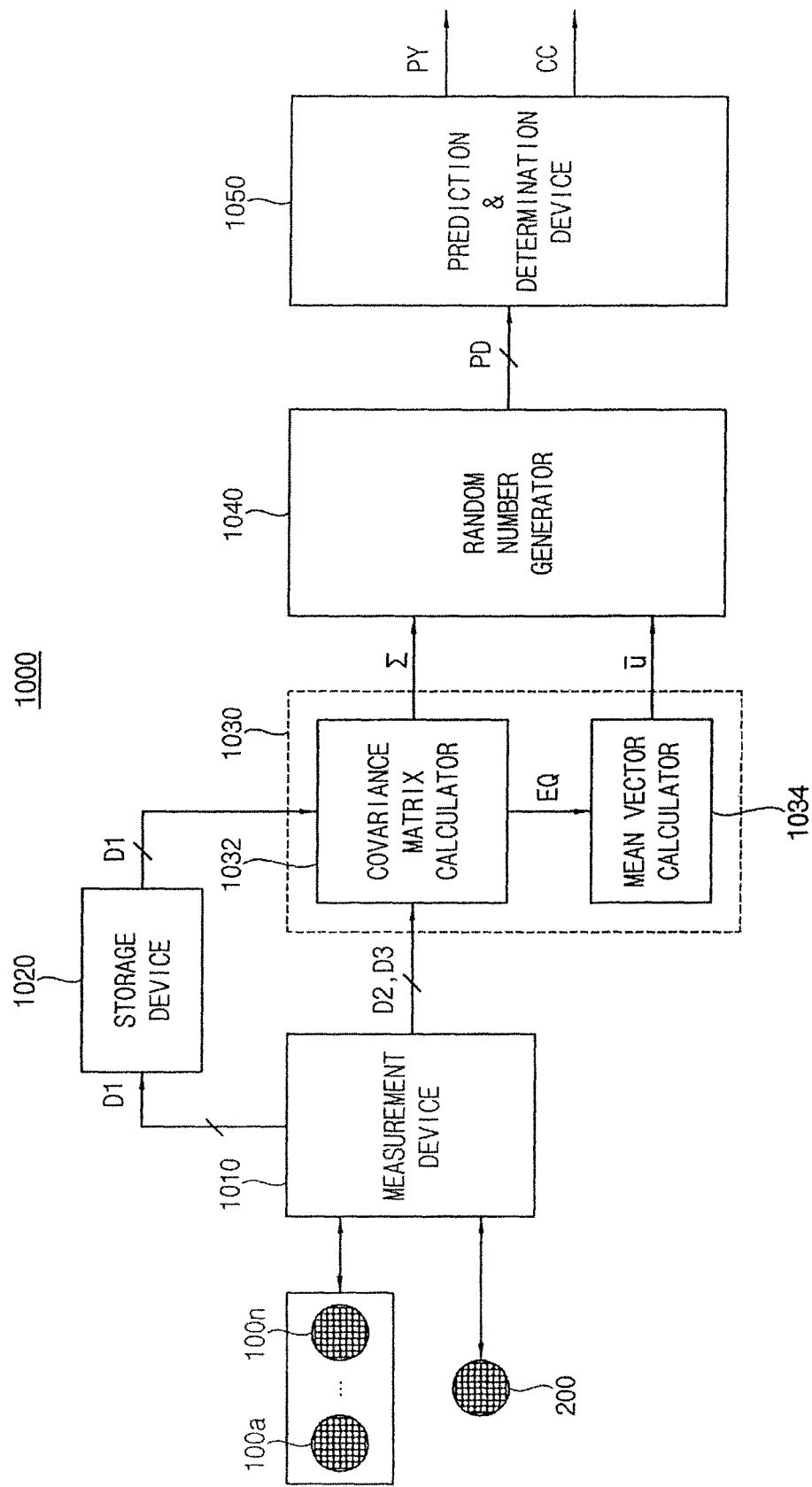
FIG. 15 illustrates an embodiment of an apparatus for predicting characteristics of semiconductor devices.

FIG. 15 illustrates an embodiment of an apparatus 1000 for predicting characteristics of semiconductor devices. Referring to FIG. 15, the prediction apparatus 1000 includes a measurement device (e.g., measurer) 1010, a calculation device (e.g., calculator) 1030, and a random number generator 1040. The prediction apparatus 1000 may further include a storage device 1020 and a prediction and determination device (e.g., processor) 1050.

The measurement device 1010 collects a plurality of first data D1 for a plurality of first characteristics from a plurality of first semiconductor devices in a plurality of semiconductor wafers 100a~100n and already in mass production. The measurement device 1010 collects a plurality of second data D2 for the plurality of first characteristics and a plurality of third data D3 for a plurality of second characteristics from at least one second semiconductor device in a semiconductor wafer 200 that is manufactured as an experimental sample before beginning the mass production. Operations S100 and S200 in FIG. 1 may be performed by the measurement device 1010.

The storage device 1020 may store the plurality of first data D1 and may provide the plurality of first data D1 to the calculation device 1030.

The calculation device 1030 includes a covariance matrix calculator 1032 and a mean vector calculator 1034. The covariance matrix calculator 1032 obtains a covariance matrix $\Sigma$ based on the plurality of first data D1, the plurality of second data D2, and the plurality of third data D3. The mean vector calculator 1034 obtains a mean vector $\bar{u}$ for a plurality of third semiconductor devices to be in the mass production. The second and third semiconductor devices may be the same type of semiconductor device. The covariance matrix Z and the mean vector $\bar{u}$ may have structures, for example, as illustrated in FIGS. 3A and 3B, respectively. Operations S300 and S400 in FIG. 1 may be performed by the calculation device 1030. For example, a first equation model EQ may be used to obtain the covariance matrix $\Sigma$ and the mean vector $\bar{u}$, and the covariance matrix calculator 1032 may set the first equation model EQ and may provide information associated with the first equation model EQ to the mean vector calculator 1034.

The random number generator 1040 obtains a plurality of prediction data PD for the plurality of third semiconductor devices based on the covariance matrix $\Sigma$ and the mean vector $\bar{u}$. Operation S500 in FIG. 1 may be performed by the random number generator 1040.

The prediction and determination device 1050 may obtain a predicted yield PY based on the plurality of prediction data PD and may generate a condition change signal CC for changing at least one of a plurality of conditions when the predicted yield PY is less than a reference yield. The predicted yield may represent a yield in which the plurality of third semiconductor devices are in mass production, and the plurality of conditions may be for the mass production of the plurality of third semiconductor devices. Operations S600, S700 and S800 in FIG. 14 may be performed by the prediction and determination device 1050.

In some example embodiments, at least a part of the method and/or the apparatus 1000 according to example embodiments may be implemented as hardware. For example, the method and/or the apparatus 1000 according to example embodiments may be included in a computer-based electronic system. In other example embodiments, at least a part of the method and/or the apparatus 1000 according to example embodiments may be implemented as instruction codes or program routines (e.g., a software program). For example, the instruction codes or the program routines may be executed by a computer-based electronic system, and may be stored in any storage device located inside or outside the computer-based electronic system.

Figure 16:
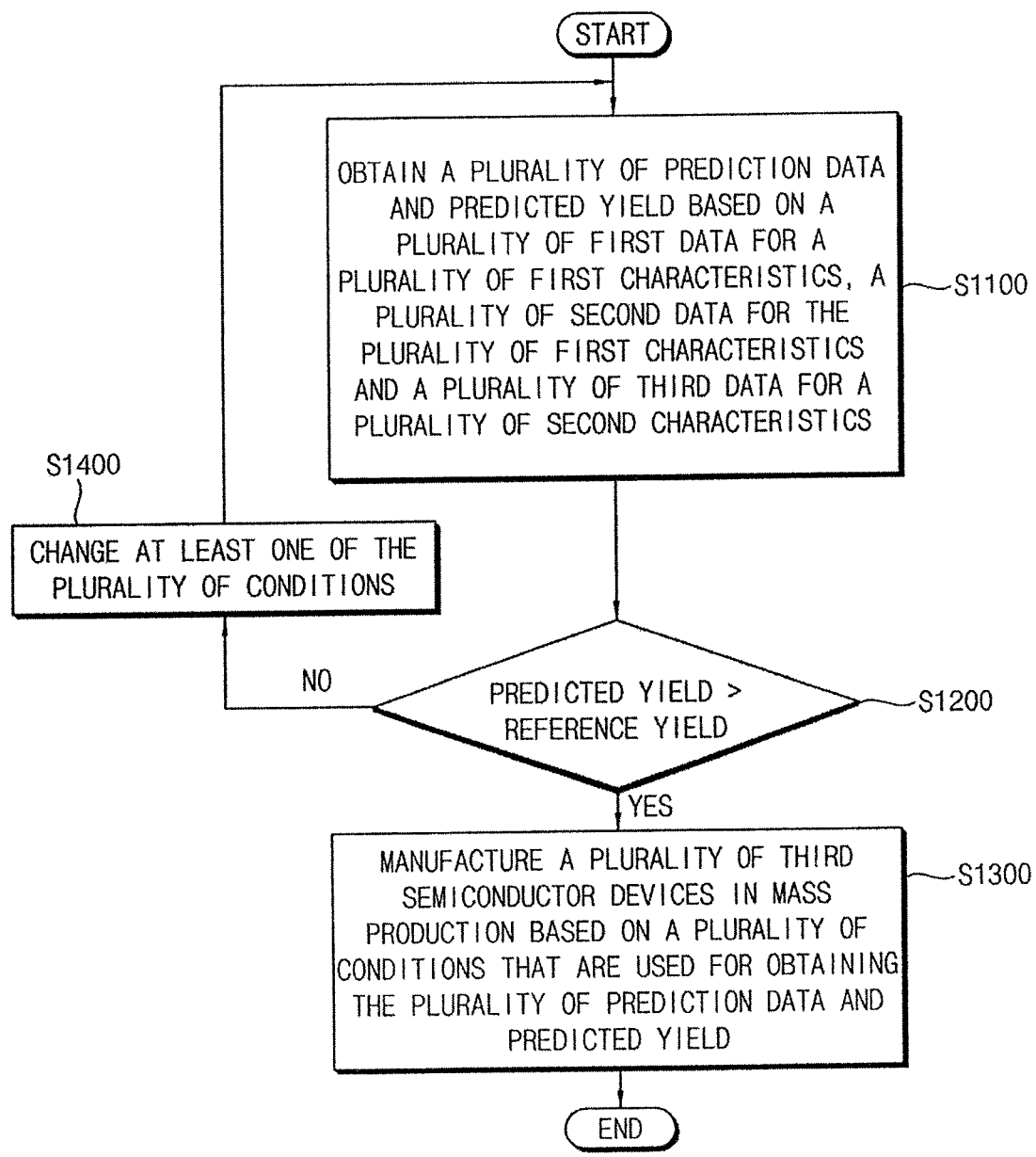
FIG. 16 illustrates an embodiment of a method for manufacturing semiconductor devices.

FIG. 16 illustrates a flow chart of an embodiment of a method for manufacturing semiconductor devices. Referring to FIG. 16, this method includes obtaining a plurality of prediction data and a predicted yield based on a plurality of first data for a plurality of first characteristics, a plurality of second data for the plurality of first characteristics, and a plurality of third data for a plurality of second characteristics (S1100). The plurality of first data are collected from a plurality of first semiconductor devices that are already in mass production. The plurality of second data and the plurality of third data are collected from at least one second semiconductor device manufactured as an experimental sample before beginning the mass production. The plurality of prediction data represent data for a plurality of third semiconductor devices to be in the mass production. The second and third semiconductor devices may be the same type of semiconductor device. The predicted yield represents a yield in which the plurality of third semiconductor devices are in mass production.

Operation S1100 in FIG. 16 may include operations S100, S200, S300, S400, S500, and S600 in FIG. 14, and operations S1200 and S1400 in FIG. 16 may be substantially the same as operations S700 and S800, respectively.

When the predicted yield is greater than the reference yield (S1200: YES), the plurality of third semiconductor devices are manufactured in the mass production based on a plurality of conditions used for obtaining the plurality of prediction data and the predicted yield (S1300). The plurality of real or actual data of FIG. 12 may be obtained or collected from the plurality of third semiconductor devices.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments described herein.

For example, one or more of the embodiments disclosed herein may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device. For example, the computer readable medium may be a non-transitory computer readable medium.

The processors, devices, calculators, generators, predictors, and other signal and information generating, obtaining, collecting, and processing features of the disclosed embodiments may be implemented in logic which, for example, may include hardware, software, or both. When implemented at least partially in hardware, the processors, devices, calculators, generators, predictors, and other signal and information generating obtaining, collecting, and processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the processors, devices, calculators, generators, predictors, and other signal and information generating obtaining, collecting, and processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods herein.

Moreover, the various operations of methods described above may be performed by any suitable means capable of performing the operations, such as various hardware and/or software component(s), circuits, and/or module(s).

The software may comprise an ordered listing of executable instructions for implementing logical functions, and can be embodied in any "processor-readable medium" for use by or in connection with an instruction execution system, apparatus, or device, such as a single or multiple-core processor or processor-containing system.

The blocks or operations of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

One or more embodiments disclosed herein may be applied in a development phase of various types of semiconductor devices, and various prediction apparatuses for characteristics of various types of semiconductor devices to be in mass production. From a business point of view, the embodiments disclosed herein provide a sufficient and accurate perspective of yield (e.g., fail rate) before mass production starts. Further, these embodiments allow fail rate to be accurately estimated prior to mass production, thereby improving efficiency and costs.

Also, in accordance with one or more of the aforementioned embodiments, a plurality of second characteristics of a plurality of third semiconductor devices to be in the mass production may be predicted based on the plurality of first characteristics of the plurality of first semiconductor devices already in the mass production and a plurality of first and second characteristics of at least one second semiconductor device manufactured as an experimental sample. Using the covariance matrix and the mean vector having specific structures, characteristics of the semiconductor devices to be in the mass production may be efficiently predicted based on the limited number of experimental samples.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A method for predicting characteristics of semiconductor devices, the method comprising:
manufacturing an experimental sample semiconductor device;
manufacturing a plurality of first semiconductor devices by mass production, after manufacturing the experimental sample semiconductor device;
measuring a plurality of first characteristics of the plurality of first semiconductor devices to generate a plurality of first data for the plurality of first characteristics for the plurality of first semiconductor devices;
measuring the plurality of first characteristics and a plurality of second characteristics of the experimental sample semiconductor device to generate a plurality of second data for the plurality of first characteristics and a plurality of third data for the plurality of second characteristics for the experimental sample semiconductor device;
obtaining a covariance matrix based on the plurality of first data, the plurality of second data, and the plurality of third data;
obtaining a mean vector for a plurality of third semiconductor devices to be manufactured by mass production after the plurality of first semiconductor devices, the experimental sample semiconductor device and the plurality of third semiconductor devices being a same type of semiconductor device;
obtaining a plurality of prediction data for the plurality of third semiconductor devices based on the covariance matrix and the mean vector;
based on the plurality of prediction data, changing a condition for one or more of a design or a process for the mass production of the plurality of third semiconductor devices; and
manufacturing the plurality of third semiconductor devices according to the changed condition,
wherein the covariance matrix includes:
a plurality of first elements, which represent covariances between the plurality of first characteristics, a plurality of second elements, which represent covariances between the plurality of first characteristics and the plurality of second characteristics, and covariances between the plurality of second characteristics, a plurality of third elements, which represent covariances between a plurality of residues for the plurality of second characteristics, a plurality of fourth elements, which represent a first zero matrix, and a plurality of fifth elements, which represent a second zero matrix.

2. The method as claimed in claim 1, wherein obtaining the covariance matrix includes:
calculating the plurality of first elements based on the plurality of first data;
calculating the plurality of second elements based on a first equation model, the plurality of second data, the plurality of third data, and the plurality of first elements;
calculating the plurality of third elements based on the first equation model, the plurality of second data, and the plurality of third data; and
setting each of the plurality of fourth elements and each of the plurality of fifth elements to zero.

3. The method as claimed in claim 2, wherein calculating the plurality of second elements includes:
setting the first equation model to a linear combination formula;
determining a plurality of linear coefficients and a plurality of constants for the linear combination formula based on the plurality of second data and the plurality of third data; and
calculating the plurality of second elements based on the plurality of linear coefficients and the plurality of first elements.

4. The method as claimed in claim 3, wherein calculating the plurality of third elements includes:
calculating the plurality of residues based on the linear combination formula including the plurality of linear coefficients and the plurality of constants, the plurality of second data, and the plurality of third data, wherein the plurality of residues represent gaps between predicted values and observed values of the plurality of second characteristics; and
calculating the plurality of third elements based on the plurality of residues.

5. The method as claimed in claim 2, wherein the mean vector includes:
a plurality of first mean values for the plurality of first characteristics,
a plurality of second mean values for the plurality of second characteristics, and
a plurality of residue mean values for the plurality of second characteristics.

6. The method as claimed in claim 5, wherein obtaining the mean vector includes:
setting the plurality of first mean values to a plurality of target values;
calculating the plurality of second mean values based on the first equation model and the plurality of first mean values; and
setting each of the plurality of residue mean values to zero.

7. The method as claimed in claim 1, wherein obtaining the plurality of prediction data includes:

generating a plurality of first random numbers based on the covariance matrix and the mean vector;
generating a plurality of second random numbers based on the covariance matrix and the mean vector; and
generating the plurality of prediction data by adding the plurality of first random numbers to the plurality of second random numbers.

8. The method as claimed in claim 7, wherein the plurality of prediction data include data for the plurality of second characteristics associated with the plurality of third semiconductor devices.

9. The method as claimed in claim 1, further comprising:
obtaining a predicted yield based on the plurality of prediction data,
wherein the predicted yield represents a yield in which the plurality of third semiconductor devices are in the mass production.

10. The method as claimed in claim 9,
wherein changing the condition for one or more of a design or a process for the mass production of the plurality of third semiconductor devices occurs when the predicted yield is less than a reference yield.

11. The method as claimed in claim 10, wherein changing the condition for one or more of a design or a process for the mass production of the plurality of third semiconductor devices includes changing a design condition for the plurality of third semiconductor devices.

12. The method as claimed in claim 10, wherein changing the condition for one or more of a design or a process for the mass production of the plurality of third semiconductor devices includes changing a process or a process condition for manufacturing the plurality of third semiconductor devices.

13. The method as claimed in claim 10, wherein the condition for one or more of a design or a process for the mass production of the plurality of third semiconductor devices includes changing a product specification for the plurality of third semiconductor devices.

14. The method as claimed in claim 1, wherein:
measuring the plurality of first characteristics includes measuring characteristics of transistors in the first semiconductor device or the experimental sample semiconductor device, and
measuring the plurality of second characteristics includes measuring product characteristics of the experimental sample semiconductor device.

15. The method as claimed in claim 14, wherein:
measuring the plurality of first characteristics includes measuring threshold voltages of the transistors in the first semiconductor device or the experimental sample semiconductor device, and
measuring the plurality of second characteristics includes measuring a static current and a lowest operation voltage of the experimental sample semiconductor device.

16. An apparatus for predicting characteristics of semiconductor devices, comprising:
a measurer to measure a plurality of first characteristics of an experimental sample semiconductor device and a plurality of first semiconductor devices manufactured by mass production after the experimental sample semiconductor device, and to generate a plurality of first data for the plurality of first characteristics for the plurality of first semiconductor devices, and generate a plurality of second data for the plurality of first characteristics and a plurality of third data from a plurality of measured second characteristics from the experimental sample semiconductor device;

a storage area to store the plurality of first data;

a calculator to obtain a covariance matrix based on the plurality of first data, the plurality of second data, and the plurality of third data, to obtain a mean vector for a plurality of third semiconductor devices to be manufactured by mass production after the plurality of first semiconductor devices, the experimental sample semiconductor device and the plurality of third semiconductor devices being a same type of semiconductor device;

a random number generator to obtain a plurality of prediction data for the plurality of third semiconductor devices based on the covariance matrix and the mean vector; and a processor to obtain a predicted yield based on the plurality of prediction data and, when the predicted yield is less than a reference yield, to change a condition for one or more of a design or a process for the mass production of the plurality of third semiconductor devices, wherein:

the covariance matrix includes:
 a plurality of first elements, which represent covariances between the plurality of first characteristics,
 a plurality of second elements, which represent covariances between the plurality of first characteristics and the plurality of second characteristics, and covariances between the plurality of second characteristics,
 a plurality of third elements, which represent covariances between a plurality of residues for the plurality of second characteristics,
 a plurality of fourth elements, which represent a first zero matrix, and
 a plurality of fifth elements, which represent a second zero matrix.

17. The apparatus as claimed in claim 16, wherein:
the predicted yield represents a yield of the plurality of third semiconductor devices in the mass production.

18. A method for manufacturing semiconductor devices, the method comprising:
obtaining a plurality of prediction data and a predicted yield based on a plurality of first data for a plurality of first characteristics, a plurality of second data for the plurality of first characteristics and a plurality of third data for a plurality of second characteristics, the plurality of first data to be collected from a plurality of first semiconductor devices already in mass production, the plurality of second data and the plurality of third data to be collected from at least one second semiconductor device manufactured as an experimental sample before beginning the mass production, the plurality of prediction data representing data for a plurality of third semiconductor devices to be in the mass production, the second semiconductor device and the plurality of third semiconductor devices being a same type of semiconductor device, the predicted yield representing a yield in which the plurality of third semiconductor devices are in the mass production; and manufacturing the plurality of third semiconductor devices in the mass production based on a plurality of conditions for obtaining the plurality of prediction data and the predicted yield, wherein obtaining the plurality of prediction data and the predicted yield includes:

collecting the plurality of first data;

collecting the plurality of second data and the plurality of third data;

obtaining a covariance matrix based on the plurality of first data, the plurality of second data, and the plurality of third data, wherein the covariance matrix includes:
 a plurality of first elements, which represent covariances between the plurality of first characteristics,
 a plurality of second elements, which represent covariances between the plurality of first characteristics and the plurality of second characteristics, and covariances between the plurality of second characteristics,
 a plurality of third elements, which represent covariances between a plurality of residues for the plurality of second characteristics,
 a plurality of fourth elements, which represent a first zero matrix, and
 a plurality of fifth elements, which represent a second zero matrix;

obtaining a mean vector for the plurality of third semiconductor devices;

obtaining the plurality of prediction data based on the covariance matrix and the mean vector; and obtaining the predicted yield based on the plurality of prediction data.

19. The method as claimed in claim 18, further comprising:
changing at least one of the plurality of conditions when the predicted yield is less than a reference yield.

* * * * *